US010518447B2

(12) United States Patent
Ullmann et al.

(10) Patent No.: US 10,518,447 B2
(45) Date of Patent: Dec. 31, 2019

(54) FOIL BODY, METHOD FOR BACK-INJECTION MOLDING A FOIL BODY AND BACK-INJECTION MOLDING TOOL

(71) Applicants: Andreas Ullmann, Zirndorf (DE); Walter Fix, Furth (DE)

(72) Inventors: Andreas Ullmann, Zirndorf (DE); Walter Fix, Furth (DE)

(73) Assignee: PolyIC GmbH & CO. KG, Furth (DE)

(*) Notice: Subject to any disclaimer, the term of this patent is extended or adjusted under 35 U.S.C. 154(b) by 436 days.

(21) Appl. No.: 14/894,576

(22) PCT Filed: May 27, 2014

(86) PCT No.: PCT/EP2014/060946
§ 371 (c)(1),
(2) Date: Nov. 30, 2015

(87) PCT Pub. No.: WO2014/195188
PCT Pub. Date: Dec. 11, 2014

(65) Prior Publication Data
US 2016/0229098 A1 Aug. 11, 2016

(30) Foreign Application Priority Data
Jun. 5, 2013 (DE) .................. 10 2013 105 802

(51) Int. Cl.
*B29C 45/14* (2006.01)
*B29L 31/34* (2006.01)
(Continued)

(52) U.S. Cl.
CPC .. *B29C 45/14836* (2013.01); *B29C 45/14073* (2013.01); *B29C 45/14754* (2013.01);
(Continued)

(58) Field of Classification Search
CPC ................... B29C 45/14836; B29C 45/14073
(Continued)

(56) References Cited

U.S. PATENT DOCUMENTS 2,789,932 A * 4/1957 Yaeger ............. B32B 17/10036
428/415
2,989,419 A * 6/1961 Lamason ................... C09J 7/50
428/353
(Continued)

FOREIGN PATENT DOCUMENTS

DE    102007057934 A1    6/2009
DE    102011006402       6/2009
(Continued)

OTHER PUBLICATIONS

Machine Translation of JP 2012-011691 A.*
(Continued)

*Primary Examiner* — Robert C Dye
*Assistant Examiner* — Russell E Sparks
(74) *Attorney, Agent, or Firm* — Raymond J. Lillie

(57) ABSTRACT

The invention relates to a film body, a method for the back-injection molding of a film body and a back-injection molding tool therefor. In particular, the invention relates to a method for the back-injection molding of layer electrodes (1) for producing touch-sensitive sensors for example for touch screens. Parts of the layer electrode (1), which after the back-injection molding should still be able to move freely, are covered by a sacrificial film (3) before and during the back-injection molding.

12 Claims, 14 Drawing Sheets

(51) Int. Cl.
    *B29K 101/12*     (2006.01)
    *B29K 623/00*     (2006.01)
    *B29K 627/06*     (2006.01)
    *B29K 669/00*     (2006.01)

(52) U.S. Cl.
    CPC ........... *B29C 2045/1477* (2013.01); *B29C 2045/14155* (2013.01); *B29C 2045/14844* (2013.01); *B29K 2101/12* (2013.01); *B29K 2623/06* (2013.01); *B29K 2627/06* (2013.01); *B29K 2669/00* (2013.01); *B29K 2995/0026* (2013.01); *B29L 2031/34* (2013.01); *B29L 2031/3475* (2013.01)

(58) Field of Classification Search
    USPC ........................................................ 264/511
    See application file for complete search history.

(56) References Cited

U.S. PATENT DOCUMENTS

| | | | |
|---|---|---|---|
| 4,113,981 A | | 9/1978 | Fujita et al. |
| 4,681,528 A | * | 7/1987 | Maruyama ............ B29C 45/234 |
| | | | 425/562 |
| 5,003,222 A | | 3/1991 | Washo |
| 7,548,206 B2 | * | 6/2009 | Hong ..................... H01Q 1/002 |
| | | | 343/700 MS |
| 7,862,676 B2 | * | 1/2011 | Aoshima ................ B26D 5/32 |
| | | | 156/160 |
| 9,389,257 B2 | | 7/2016 | Bolte et al. |
| 2002/0066973 A1 | | 6/2002 | Visconti et al. |
| 2005/0106784 A1 | * | 5/2005 | Xia .................. B29C 45/14065 |
| | | | 438/125 |
| 2005/0153026 A1 | * | 7/2005 | Mannion ........... B29C 45/14336 |
| | | | 426/110 |
| 2006/0082556 A1 | | 4/2006 | Baker et al. |
| 2008/0213541 A1 | | 9/2008 | Schilling et al. |
| 2011/0134655 A1 | | 6/2011 | Ohtani et al. |
| 2012/0193130 A1 | | 2/2012 | fix et al. |
| 2012/0098790 A1 | * | 4/2012 | Han ........................ G06F 3/044 |
| | | | 345/174 |
| 2012/0267229 A1 | | 10/2012 | Lin |
| 2013/0234732 A1 | * | 9/2013 | Lee .................... H05K 13/0023 |
| | | | 324/658 |
| 2014/0145731 A1 | | 5/2014 | Bolte et al. |
| 2015/0257265 A1 | | 9/2015 | Ullmann et al. |
| 2015/0293558 A1 | | 10/2015 | Hahn et al. |

FOREIGN PATENT DOCUMENTS

| | | | |
|---|---|---|---|
| DE | 2009014757 A1 | 10/2010 | |
| DE | 102009014575 A1 | 10/2010 | |
| DE | 102010044598 B3 | 1/2012 | |
| DE | 10 2010 032 951 A1 | 2/2012 | |
| DE | 102011006402 A1 | 10/2012 | |
| DE | 10 2011103824 A1 | 12/2012 | |
| DE | 102012112445 A1 | 6/2014 | |
| EP | 1100043 A2 | 5/2000 | |
| EP | 1 100 043 A2 | 5/2001 | |
| EP | 2228258 A2 | 9/2009 | |
| EP | 2 228 258 A2 | 9/2010 | |
| EP | 2695715 A | 2/2014 | |
| JP | 2009238661 A | 10/2009 | |
| JP | 2011-240679 A | 12/2011 | |
| JP | 2012-011691 A | 1/2012 | |
| WO | WO99/17261 | 4/1999 | |
| WO | WO2010/072163 A1 | 7/2010 | |
| WO | WO-2014060335 A1 * | 4/2014 | ......... B29C 45/1418 |

OTHER PUBLICATIONS

Machine translation of JP 2011240679. (Year: 2011).*
Machine translation of WO 2014060335 (Year: 2014).*
International Search reports this application and related application.
Examination reports in corresponding non-patent German application and related application.
Designlosungen mit gesteigerter Functionalitat, Ehrig et al, Design und Marketing, Swiss Plastics, pp. 16-20,Jun. 2011.
Touchskin-nicht touchscreen p. 30, Reinhard Bauer, Plastvarbeiter Dec. 2010.
Design solutions with enhanced functionality, Frank Ehrig et al., Design and Marketing, Swiss Plastics Jun. 2011, pp. 16-17, University news.

* cited by examiner

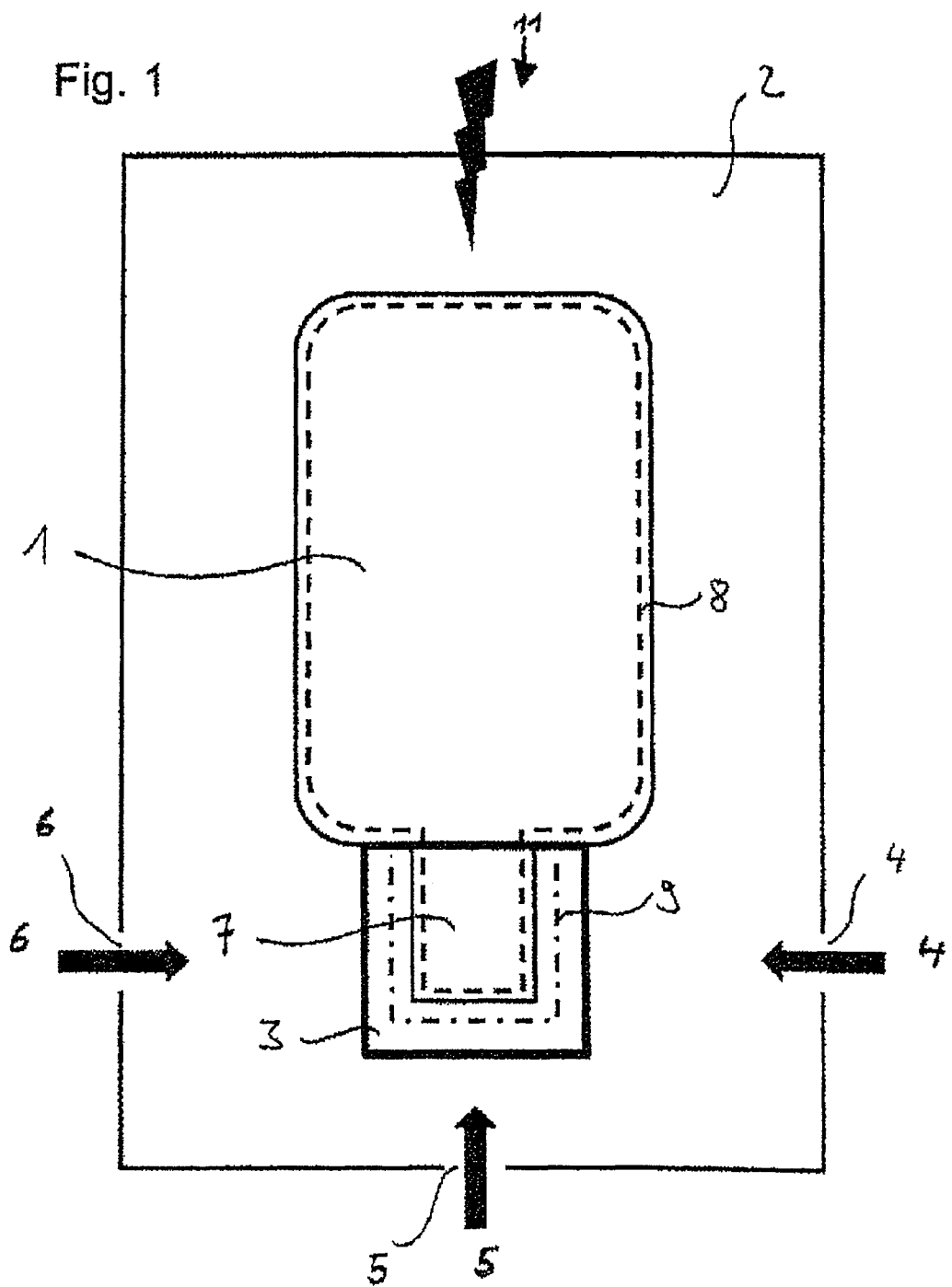

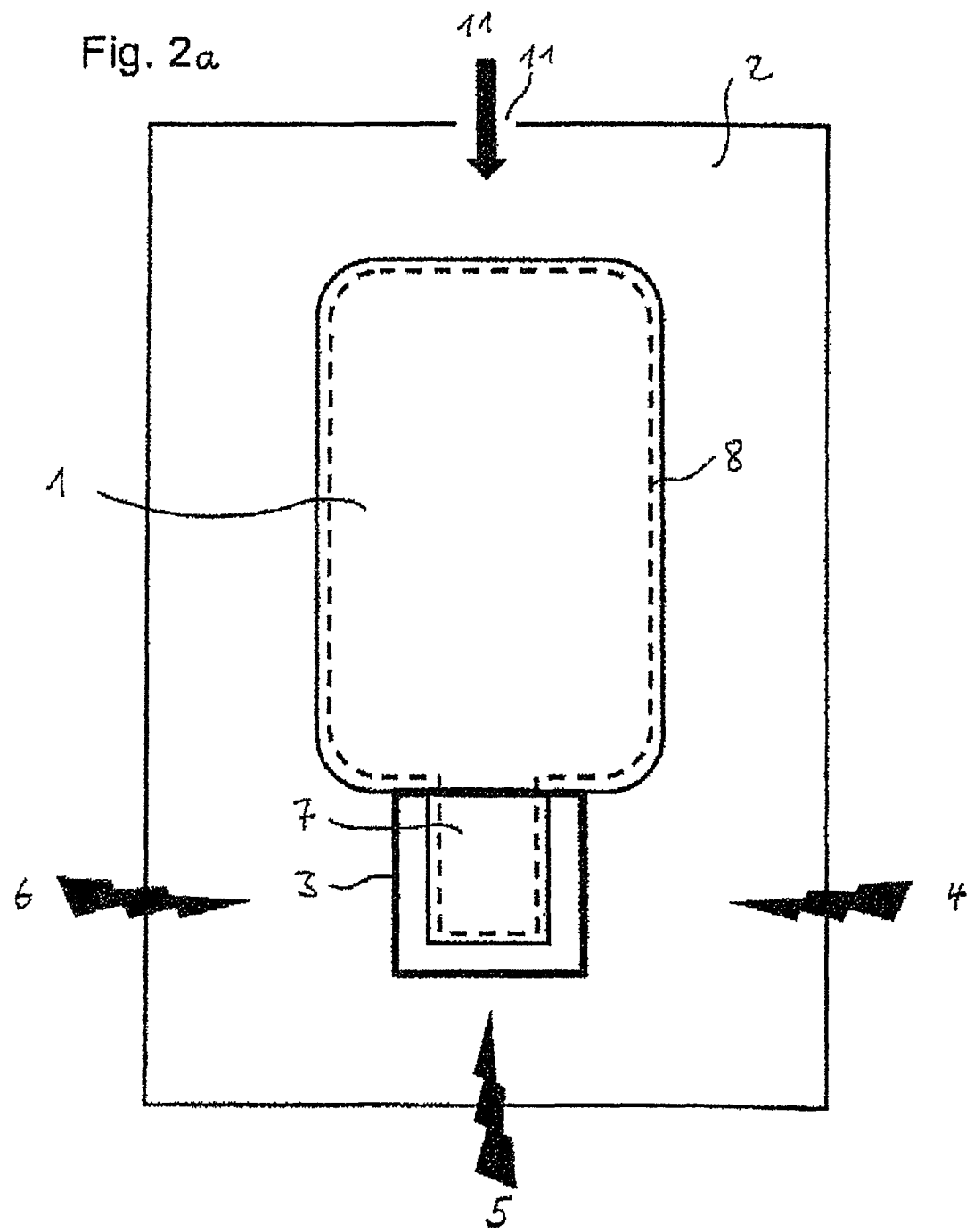

Fig. 2b
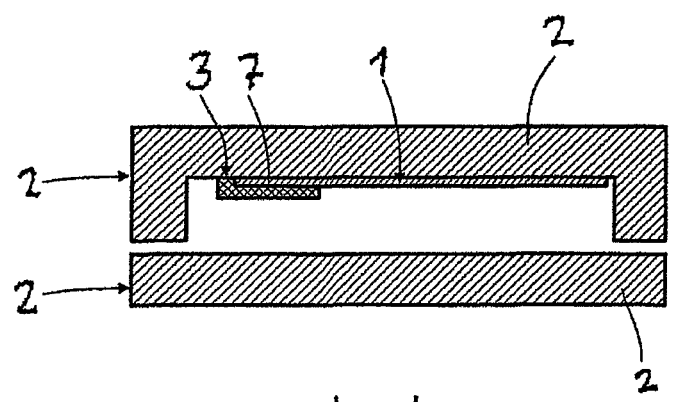
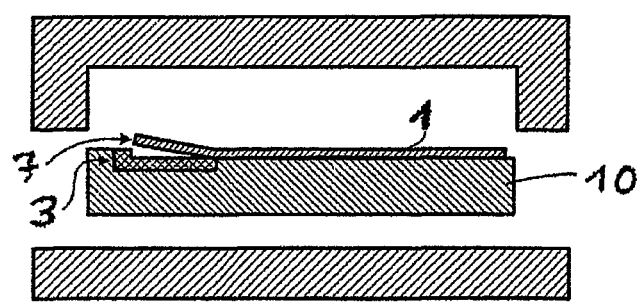

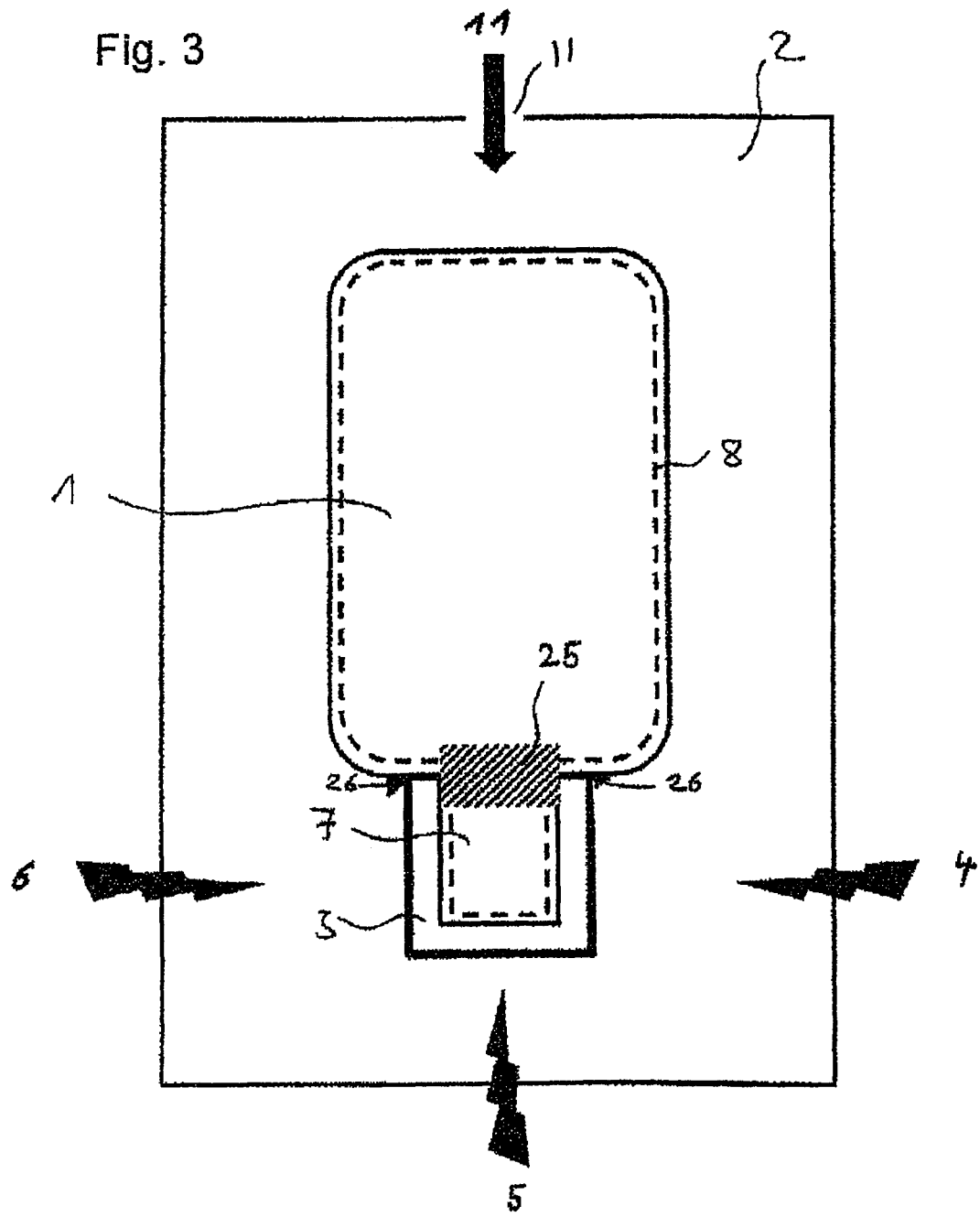

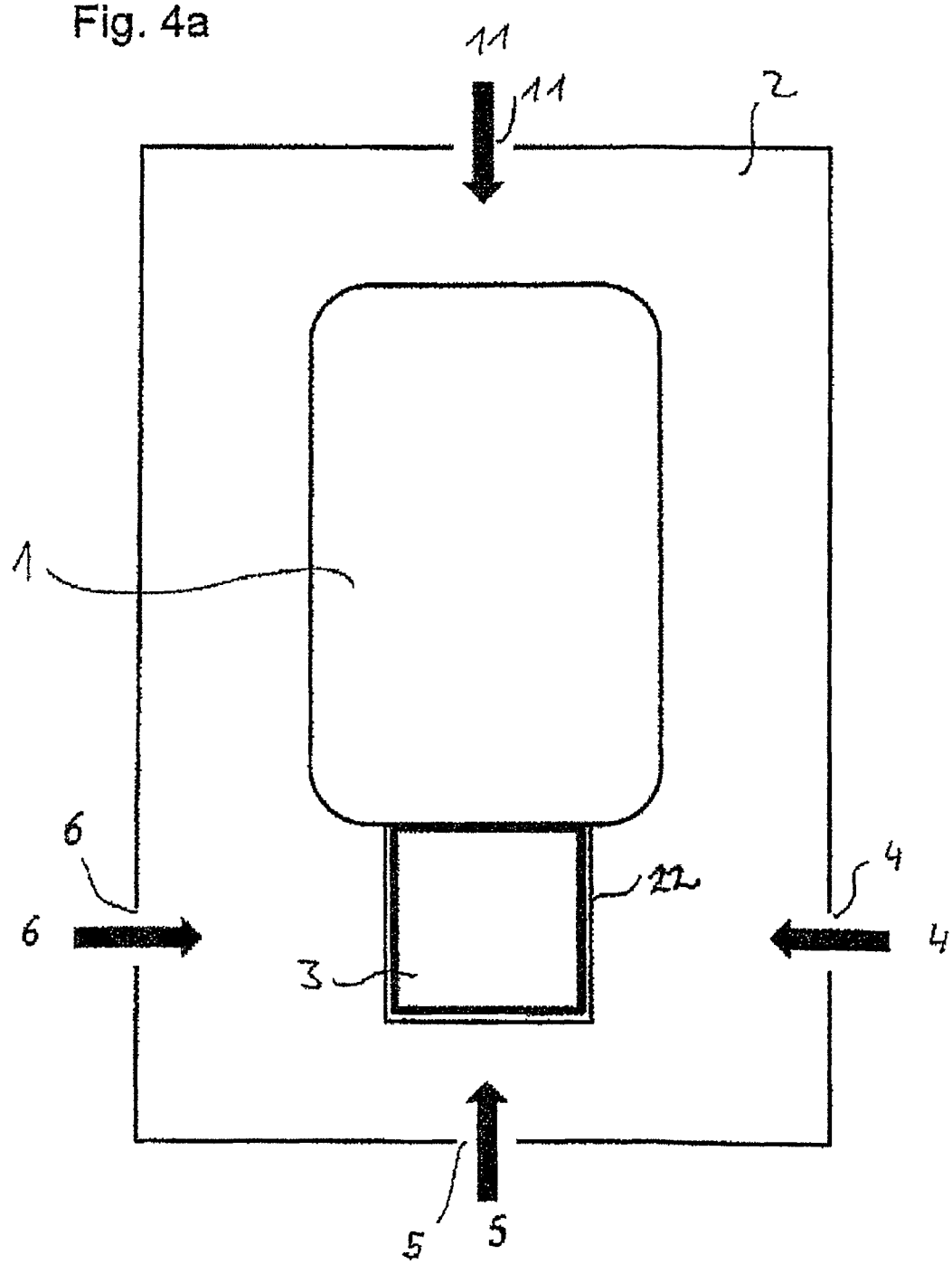

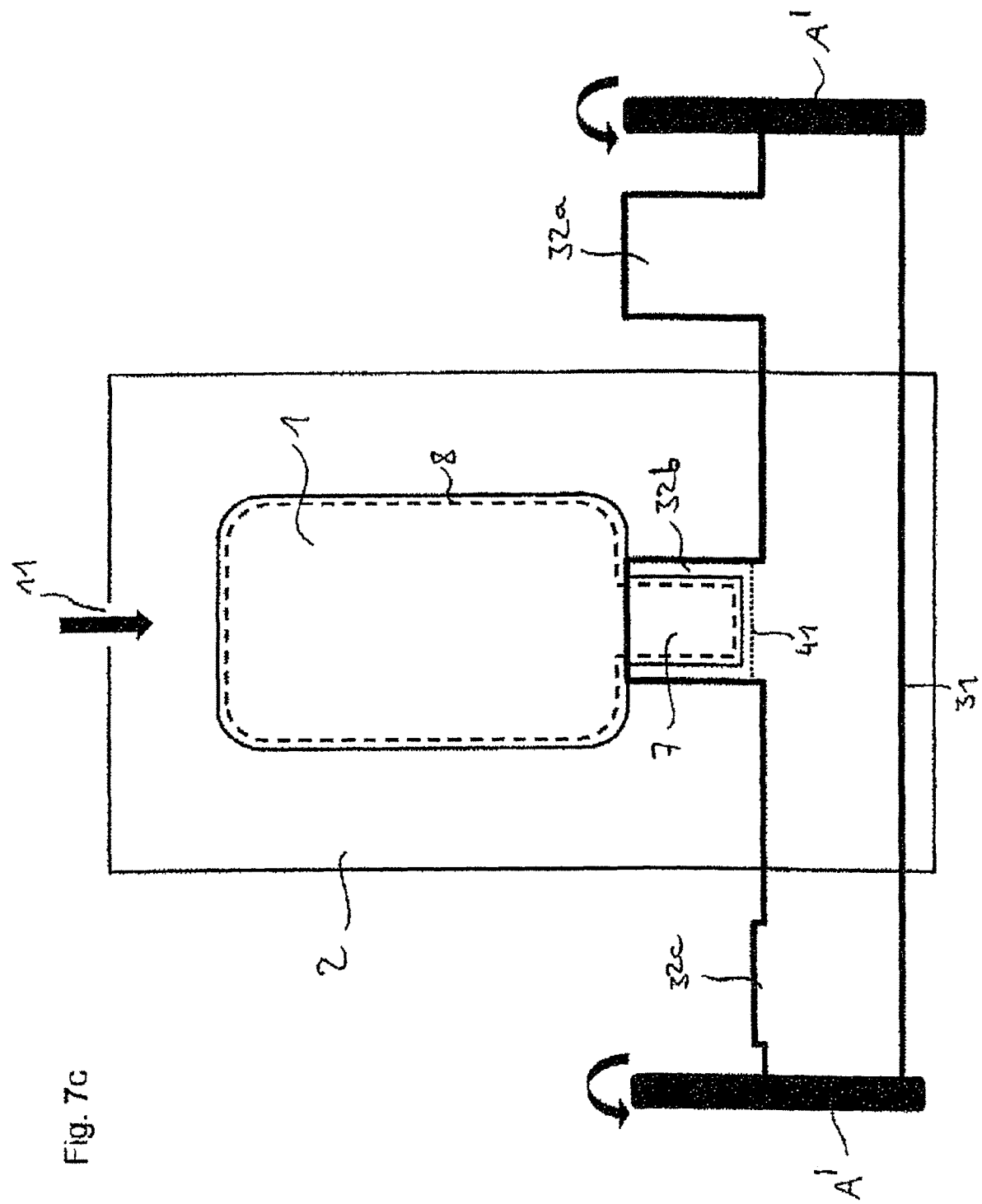

FOIL BODY, METHOD FOR BACK-INJECTION MOLDING A FOIL BODY AND BACK-INJECTION MOLDING TOOL

This application is the national phase application, under 35 U.S.C. 371, of PCT Application No. PCT/EP2014/060946, filed May 27, 2014, which claims priority based on German Patent Application No. 102013105802.7, filed Jun. 5, 2013, the contents of which are hereby incorporated by reference in their entireties.

The invention relates to a film body, a method for the back-injection molding of a film body and a back-injection molding tool therefor. In particular, the invention relates to a method for the back-injection molding of layer electrodes for touch screens.

Layer electrodes form the core of a touch screen. In these layer electrodes, the individual sensor arrays are contacted and the supply lines are brought together at the edge of the layer electrode, bundled and inserted in—for example—ZIF connectors, as so-called "tail" for the electrical connection to the touch module or the controller.

The tail is therefore a component of the film which provides the layer electrode. The section of this film described as "tail" differs from the larger part of the layer electrode in that it has a different coverage with lines than the layer electrode, including the bundled supply lines to the sensor electrode array connections of the transparent layer electrode. The film on the tail can, but does not have to be formed transparent.

Technological development at the present time is such that, preferably, flexible layer electrodes, which have carrier bodies such as films, are preferably used. Such layer electrodes are known for example from DE 10 2012 112 445.0.

These layer electrodes are usually laminated to form touch screens and the area, which comprises the tail, is left free of the adhesive layer, whereby this is then not firmly bonded to the housing, for example the "lens" or the "cover".

The object of laminating the layer electrodes in favor of a simple back-injection molding process is economically attractive.

During the back-injection molding of the layer electrodes, it is important to avoid the back-injection molding of the supply lines, in particular of the tail, such that this is not also glued.

To date, several possibilities are envisaged to protect the tail from the back-injection molding material. For example, the tail can be protected from the back-injection molding material by introducing a slide. For this, it is necessary that the layer electrode, which is placed in the back-injection molding tool by robots in the case of economically attractive processes, is positioned precisely. However, this is costly to achieve.

The object of the present invention is therefore to provide a cost-effective possibility, such that during the processing of the layer electrode by means of back-injection molding, areas of the layer electrode, which are not to be back-injection molded, such as for example the tail, remain free.

These areas are called "areas not to be back-injection molded or to remain free" below and indicate for example the tail, which is a part of the layer electrode, but which is not back-injection molded like the latter in order to produce the touch screen.

This object is achieved by the subject of the present application, as disclosed in the claims, the description and the figures.

A general finding of the invention is to attach a sacrificial film on an area of the layer electrode, for example the tail, during the back-injection molding such that this is efficiently and cost-effectively protected from the back-injection molding material and the tail can be removed without difficulty from the sacrificial film again after the back-injection molding. There are two possibilities for this: on the one hand, it is provided that the sacrificial film remains on the back-injection molded body as part of this after the back-injection molding. On the other hand, it is also possible for the sacrificial film to be peeled off again from the back-injection molded body after the back-injection molding was carried out. The sacrificial film may also be referred to as cover film or as protective film.

Correspondingly, a subject of the invention is a method for the back-injection molding of a layer electrode for producing a touch-sensitive sensor, wherein the layer electrode has at least one area which is not to be back-injection molded, comprising the following method steps:

Covering the area of the layer electrode, which is not to be back-injection molded, with a sacrificial film, Introducing the layer electrode and the sacrificial film into a back-injection molding tool, Back-injection molding of the layer electrode and the sacrificial film Formation of the touch-sensitive sensor from the produced back-injection molded body.

Likewise, subject of the present invention is a film body for a layer electrode of a touch-sensitive sensor, comprising an area which is to remain free and a sacrificial film, wherein the sacrificial film forms a composite with the layer electrode, in which the area which is to remain free is completely covered by the sacrificial film, but can be easily removed from the latter. Finally, subject of the invention is a back-injection molding tool for the back-injection molding of a layer electrode, having first vacuum lines for holding the layer electrode during the back-injection molding process and second vacuum lines for holding a sacrificial film during the back-injection molding process, wherein the first and second vacuum lines can be controlled in particular independently from each other.

According to a preferred embodiment of the method, the injection is carried out such that as little back-injection molding material as possible reaches between an area which is to remain free of the layer electrode, in particular the tail, and the sacrificial film.

For this, an opening of the back-injection molding tool is sought for the injection of the back-injection molding material through which, because of its dimensions, its contour and/or above all the location of its arrangement, the back-injection molding material strikes the film body at a point at which no cavity is present between the sacrificial film and the layer electrode and/or the sacrificial film is joined to the layer electrode in a sealing manner.

According to a preferred embodiment, the sacrificial film has at least the dimension of the area which is to remain free, thus for example of the tail.

The sacrificial film has at least the dimension of the area of the layer electrode, which is to remain free, in particular for example of the tail, preferably it projects beyond the latter, such that a not entirely precise positioning does not result in parts of the area being back-injection molded and thus glued.

According to another preferred embodiment, the sacrificial film has a rectangular, for example also a square outline.

The layer electrode preferably comprises a transparent plastic film, in particular one made from a polyolefin such as polyethylene terephthalate (PET) or polycarbonate (PC), which is printed with conductive, non-transparent, for example metallic strip conductors, such that conductivity is ensured while at the same time the film is transparent for the human eye. These conductive films are known for example from DE 10 2009 014 757.8.

According to one embodiment of the method the sacrificial film is loosely laid on the area of the layer electrode which is not to be back-injection molded, wherein means, in particular vacuum lines, are provided on the back-injection molding tool, which fix the layer electrode on the one hand, and the sacrificial film on the other in the back-injection molding tool.

For example, after the layer electrode was fixed by means of first vacuum lines, the sacrificial film can be fixed by means of second vacuum lines.

The two vacuum lines can for example be controlled independently from each other and can be operated at the same or at different pressures.

According to a further embodiment of the invention, before introduction into the back-injection molding tool, the sacrificial film is applied to the area of the layer electrode which is to remain free, for example the tail, and is fixed with the latter in the back-injection molding tool.

For this, there are several techniques which are proposed according to the invention: on the one hand, the sacrificial film can be glued over the whole surface of the area of the layer electrode which is to remain free by means of its own adhesive power or by means of an adhesive additional layer.

It is then possible to produce the sacrificial film joined together with the area which is to remain free by a fold and to simply fold over or fold back the sacrificial film depending on the desired coverage, such that the underlying area of the layer electrode is covered and thus protected from the back-injection molding.

Finally, it is possible simply to fix the sacrificial film on the layer electrode with adhesive tape at the point which is to be covered.

With all of these methods, only one film body which must be fixed in the back-injection molding tool is present during the introduction of the layer electrode into the back-injection molding tool. Therefore, conventional back-injection molding tools with only one row of vacuum lines are also sufficient according to these embodiments.

Regardless of how the sacrificial film is held on the area of the layer electrode which is to remain free, in particular the tail, before and during the back-injection molding, it is important that the connection of the area which is to remain free to the sacrificial film is easily detachable, thus it is carried out for example by means of vacuum lines, release adhesives, longitudinal adhesive stripes and/or adhesive. After the back-injection molding, the back-injection molded sacrificial film is then removed and/or peeled off again from the area which is to remain free, thus for example from the tail, without damaging it, for example also by means of cutting.

According to a preferred embodiment of the invention, the sacrificial film remains as part of the back-injection molded body on the latter and is for example also a part of the layer electrode in the touch-sensitive sensor after the formation of the layer electrode from the produced back-injection molded body.

Before the back-injection molding tool is closed, the sacrificial film covers the area of the layer electrode which is to remain free, thus for example the tail, over the whole surface and preferably fitting flush. If the coverage of the area which is to remain free by the sacrificial film is not tight all around, the direction of injection is adapted such that, in all probability, no or only a little back-injection molding material reaches between the sacrificial film and the area which is to remain free.

The back-injection molding tool is closed and the back-injection molding process begins. After the back-injection molding is completed, the sacrificial film has bonded with the back-injection molding material and the tail lies on the sacrificial film and can be moved freely. It is thus possible, that the sacrificial film has become part of the back-injection molded body or that it can also be peeled off the latter.

The layer electrode is formed from the back-injection molded body after the back-injection molding is completed, in particular cut out, for example with a laser beam.

The sacrificial film can be any type of film, which is for example polymer constructed and consists of organic material. The sacrificial film should not interact chemically with the material of the tail, especially with metal or a metal alloy. This is also true for all types of additions, both on the tail as well as on the sacrificial film.

According to a preferred embodiment, the sacrificial film is particularly thin, for example the film thickness is in the range of 1 to 250 µm, particularly preferably from 2 to 100 µm and particularly preferably from 5 µm to 75 µm.

Quite particularly preferably, the sacrificial film and the carrier film of the layer electrode have the same thickness. Hereby, similar preferred features advantageously result for both films during the back-injection molding process. Thereby, for example, the selection of the back-injection molding parameters can be facilitated.

The transparent film on which the conductive structures for the formation of the conductive functional film are imprinted is referred to here as carrier film of the layer electrode according to DE 10 2012 112 445.0.

According to a further embodiment, the sacrificial film is transparent.

On the other hand, the material of the sacrificial film can be of any type, a thin metal layer and/or a thin glass layer can also be referred to as sacrificial film here, because these materials behave like films in their thinnest form. In particular, however, under sacrificial film, a conventional type of film used in technology is also referred to, of course, such as the conventional film materials PET, PC, polypropylene, polyaniline and/or polyimide.

According to a particularly advantageous embodiment, the sacrificial film is compatible with the carrier film of the layer electrode, such that after the back-injection molding, the sacrificial film does not first have to be separated from the back-injection molding material at all. This is particularly because the sacrificial film reinforces the carrier film of the layer electrode only at the point where the tail is formed.

BRIEF DESCRIPTION OF THE DRAWINGS

The invention now will be described with respect to the drawings, wherein:

FIG. 1 is a top perspective view of a first embodiment of a layer electrode in accordance with the present invention;

FIG. 2A is another top perspective view of the layer electrode of FIG. 1; and FIG. 2B shows cross-sectional views of the layer electrode before (top) and after (bottom) back-injection molding;

FIG. 3 is a top perspective view of a second embodiment of a layer electrode in accordance with the present invention;

FIGS. 4A, 4B, and 4C are top perspective views of a third embodiment of a layer electrode in accordance with the present invention, before (FIG. 4A) and after (FIGS. 4B and 4C) back-injection molding, in which the layer electrode has a contour in the vicinity of the tail portion, wherein the contour matches that of the sacrificial film;

FIGS. 7A, 7B, and 7C depict the back-injection molding of a layer electrode using a back-injection molding tool having a fixing strip.

Figure 4B:
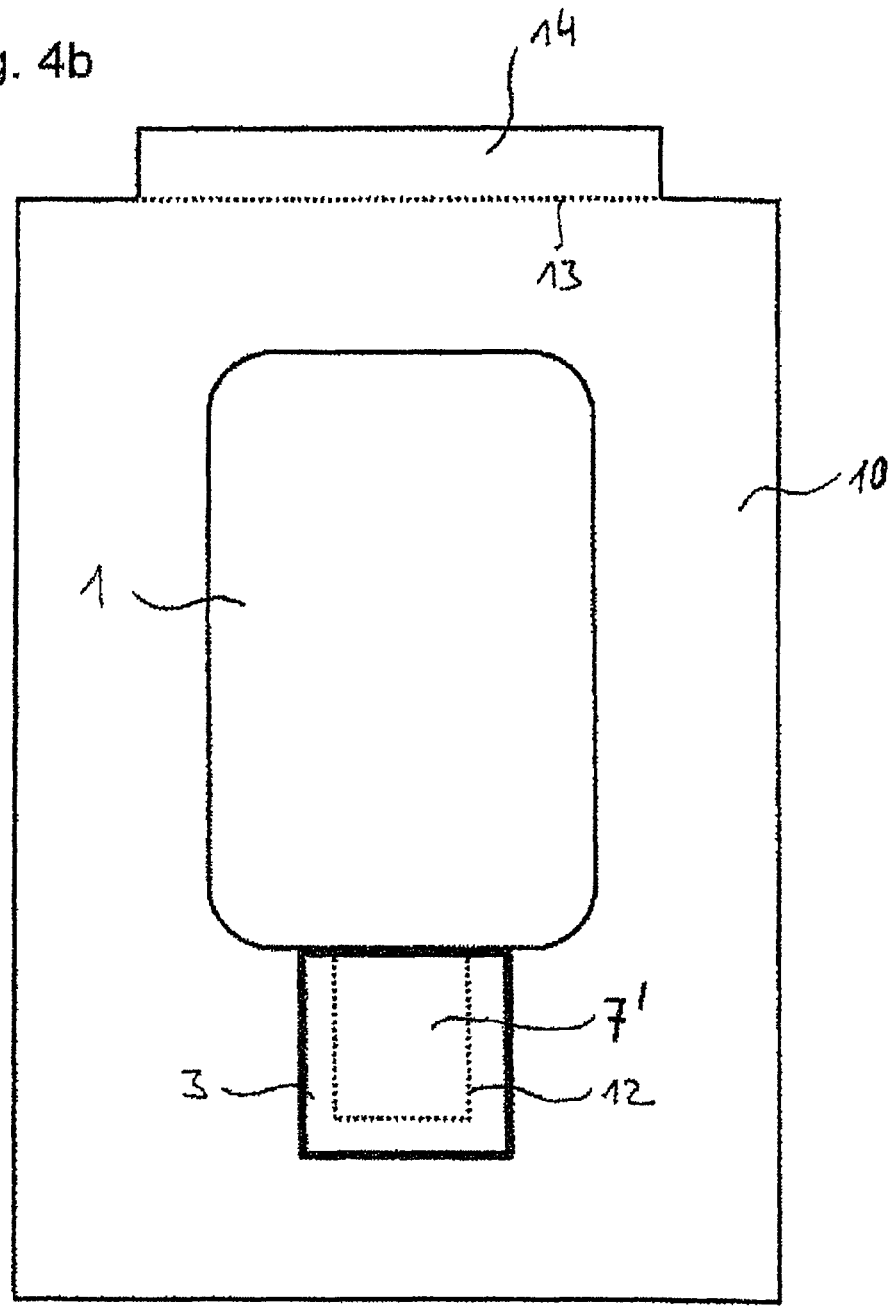

The invention is explained in more detail below, with the help of figures, which show exemplary embodiments of the film body and of the back-injection molding tool.

FIG. 1 shows a layer electrode 1 and a sacrificial film 3, which are inserted in a back-injection molding tool 2. The layer electrode 1 with the tail 7 is held by the vacuum line 8 formed in the back-injection molding tool 2, while the sacrificial film 3 is held by the second vacuum line 9 different therefrom. This is necessary because in this embodiment example, there is no coherent film body which comprises both the layer electrode 1, as well as the sacrificial film 3. Instead, here, the layer electrode 1, as first film, and the sacrificial layer 3, as second film, independent therefrom and only loosely arranged on top of each other, are present without connection between each other.

The injection of the back-injection molding material for the formation of the back-injection molded body 10 (FIG. 2b) is carried out according to the embodiment shown in FIG. 1 by means of openings 4, 5 or 6. The directions, from which the back-injection molding material (not shown) arrives in the back-injection molding tool 2, are indicated here using black arrows. From the top, from direction 11, comes an offset arrow, which shows that the direction 11 is not a preferred direction from which the back-injection molding material is introduced into the back-injection molding tool 2 from FIG. 1. If, namely, the back-injection molding material came from this direction, then it could slide between the sacrificial film 3 and the layer electrode 1 or the tail 7 in the embodiment shown here and thus specifically lift the sacrificial film from the tail 7.

In the embodiment example of FIGS. 2a and 2b, the sacrificial film 3 is present in combination with the layer electrode 1. FIG. 2a shows the top view on the film body made of layer electrode 1, tail 7 and sacrificial film 3. FIG. 2b then shows in cross-section the position of the film body from FIG. 2a in the back-injection molding tool 2 before the back-injection molding (FIG. 2b top) and after the back-injection molding (FIG. 2b bottom).

The embodiment according to FIG. 2a is different from the embodiment from FIG. 1 in that here the sacrificial film 3 is joined to the layer electrode 1. For this reason, the second vacuum line 9 is dispensed with for fixing the sacrificial film 3 in the back-injection molding tool 2. The sacrificial film 3 is held on the layer electrode 1 as part of the film body made of layer electrode 1, tail 7 and sacrificial film 3 and fixed in the back-injection molding tool 2 with the layer electrode 1 and the tail 7 by means of the vacuum line 8. For example, the sacrificial film 3 is bonded to the layer electrode 1 by means of an additional layer, such as an adhesive layer (not shown).

According to one embodiment, the sacrificial film 3 itself can be formed as adhesive layer, such that no additional layer is required. It is particularly important that the film body is joined such that the tail 7 can be removed from the sacrificial film 3 after the back-injection molding (FIG. 2b bottom). In the case that the sacrificial film 3 is formed as adhesive layer, this is stable and not sensitive to the conditions occurring during the back-injection molding, such as high temperatures etc.

In the embodiment of the invention shown in FIG. 2a, the back-injection molding material comes preferably through the opening 11 of the back-injection molding tool 2, thus from above. In contrast, the two lateral openings 4 and 6, as well as the bottom opening 5 are less preferred because back-injection molding material could reach under the sacrificial film 3.

It is finally shown in FIG. 2b how the back-injection molding proceeds in the back-injection molding tool 2.

Firstly, the film body made of layer electrode 1, tail 7 and sacrificial film 3 is held at the top in the back-injection molding tool 2 by means of vacuum lines 8 (not shown in the cross-section). Then, the back-injection molding tool 2 is closed and the back-injection molding material is injected (not shown). After the back-injection molding had ended, a back-injection molded body 10 is present, on the upper side of which the layer electrode 1 is located, the tail 7 of which is not back-injection molded directly, but which is located on the sacrificial film 3 which is back-injection molded for its part. The materials are selected such that the tail 7 can be easily removed from the sacrificial film 3. This can also be the case if a sacrificial film 3, which is an adhesive film, is present.

For example, for an embodiment of the invention according to FIGS. 2A and 2B, a sacrificial film 3 can be made of a material such as polyethylene (PE) and/or polyvinyl chloride (PVC), both characterized in that they have very smooth surfaces and are then back-injection molded with a back-injection molding material such as polymethyl methacrylate (PMMA), polycarbonate (PC), acrylonitrile butadiene styrene (ABS).

The adhesion of the sacrificial film 3 to the layer electrode 1 can be in particular carried out also without adhesive, solely by means of van der Waals interaction.

FIG. 3 shows an alternative embodiment to the film body, comprising the layer electrode 1, the tail 7 and the sacrificial film 3 from FIGS. 2A and 2B.

To be seen again in FIG. 3 are the layer electrode 1, the vacuum line 8 of the back-injection molding tool 2, the tail 7, the sacrificial film 3 covering the latter and the openings 4, 5 and 6, which are unsuitable for the back-injection molding of this embodiment, as well as the suitable opening 11, from which the back-injection molding material comes in a suitable way during the back-injection molding of this embodiment.

The embodiment of the invention shown in FIG. 3 is different from the one shown in FIG. 2a in that here the sacrificial film 3 is not joined to the layer electrode 1 by means of an additional layer or by means of an adhesive property of the sacrificial film 3 itself, but rather by means of an adhesive strip 25, which only joins the sacrificial film 3 to the layer electrode 1 in the connection area of layer electrode 1 with tail 7.

Only an exemplary length of the adhesive strip 25 is shown here, this can also extend further over the entire length of the connecting line 26 of layer electrode 1 to the sacrificial film 3. The adhesive strip 25 can just as well also be located only in sections along the connecting line 26. The layer sequence of the film body shown here in FIG. 3 along the connecting line 26 can be thus described as follows: at the very bottom, the layer electrode 1 with the tail 7 which are held in the back-injection molding tool 2 by means of the vacuum lines 8. The sacrificial film 3, only loosely arranged, is located on it, and then over it is the adhesive strip 25, which joins the sacrificial film 3 to the layer electrode 1.

Figure 4C:
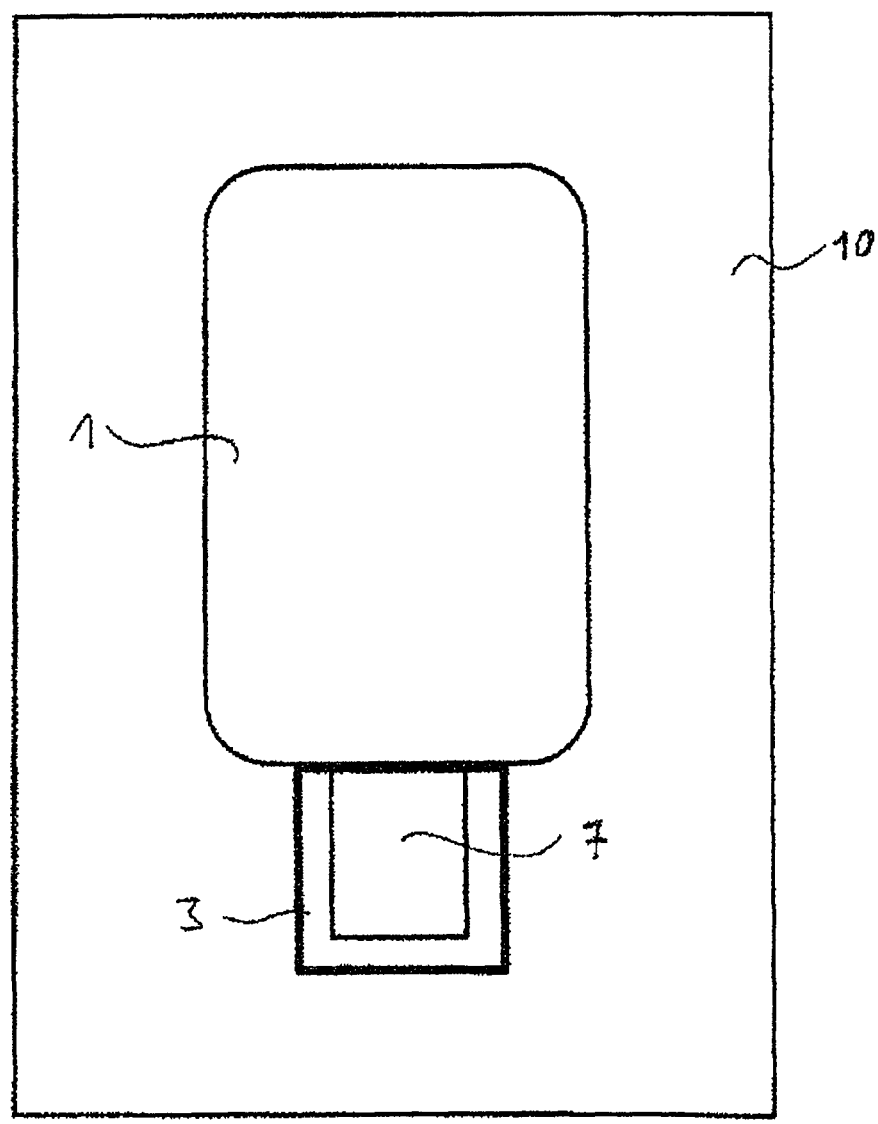

Here too, like in the embodiment example from FIG. 2 the direction of injection 11 is preferred to the directions of injection 4, 5 and 6, because material injected from these openings could reach under the sacrificial film 3 and then the area which is to remain free the tail 7, in the illustrated example, would still be back-injection molded. FIGS. 4*a*, 4*b* and 4*c* show the sequence of an embodiment of the method according to the invention.

As shown in FIG. 4*a*, the layer electrode 1 has the contour 22 in the vicinity of the tail 7. The contour 22 matches that of the sacrificial film 3 and is shown displaced in the representation only for reasons of simplicity. In the embodiment shown here, the sacrificial film 3 according to FIG. 2 is glued to the tail 7, either by means of an additional layer which glues both films together and/or in that the sacrificial film 3 itself has adhesive properties.

In reality, the contours 22 in the embodiment match those of the sacrificial film 3, such that at the end of the layer electrode 1, where later the applied tail 7 is realized, a composite of the applied tail 7 of the layer electrode 1, the sacrificial film 3 and optionally another additional layer (not shown) is present. The outline of the tail 7, as it is present, for example, after the back-injection molding and cutting, is structured in the embodiment example shown here only after the back-injection molding.

Because the contour 22 of the layer electrode 1 forms a bond with the sacrificial film 3 on three sides flush in the vicinity of the tail 7, back-injection molding material cannot reach between the two films and there is correspondingly here no preferred direction and/or preferred opening, from which the injection of the back-injection molding material is carried out.

The layer electrode 1 after the back-injection molding can be seen in FIG. 4*b*. Thus a back-injection molded body 10 is formed according to the dimensions of the back-injection molding tool. This has an injection flap 14 which shows that the injection was carried out via opening 11 (FIG. 4*a*). A touch-sensitive sensor, comprising the back-injection molded layer electrode 1, is now cut out from the back-injection molded body 10. For this, for example, a laser structuring process is used. The tail 7 is not cut out yet, but rather it is only applied in the area 7'. The tail 7 is formed by means of cutting, thus for example by applying a laser beam along the cutting line 12. Here, the laser intensity can be selected for example such that the laser beam cuts through at least the layer electrode 1 of approx. 50 μm thickness, such that the contours of the tail 7 emerge. Alternatively, at increased laser intensity, for example the sacrificial film 3 can also be structured or cut. Alternatively or additionally, the injection flap 14 can also be cut off along the cutting line 13 by means of a correspondingly adjusted laser beam. The laser structuring can be carried out in one operation, wherein in each case different laser beam intensities are used for different cuts 12 or 13.

The result of the method is shown in FIG. 4*c*: the tail 7 with the sacrificial film 3 placed behind it is formed; the injection flap 14 is removed. The back-injection molded body 10, the layer electrode 1 with tail 7 with the sacrificial film 3 placed behind it is to be seen. Thus, on the back-injection molded body 10 in the area of the tail 7, the sacrificial film 3 is first of all, and on top of this the tail 7, which can be removed from the sacrificial film 3 or which is only loosely placed on it.

Figure 5A:
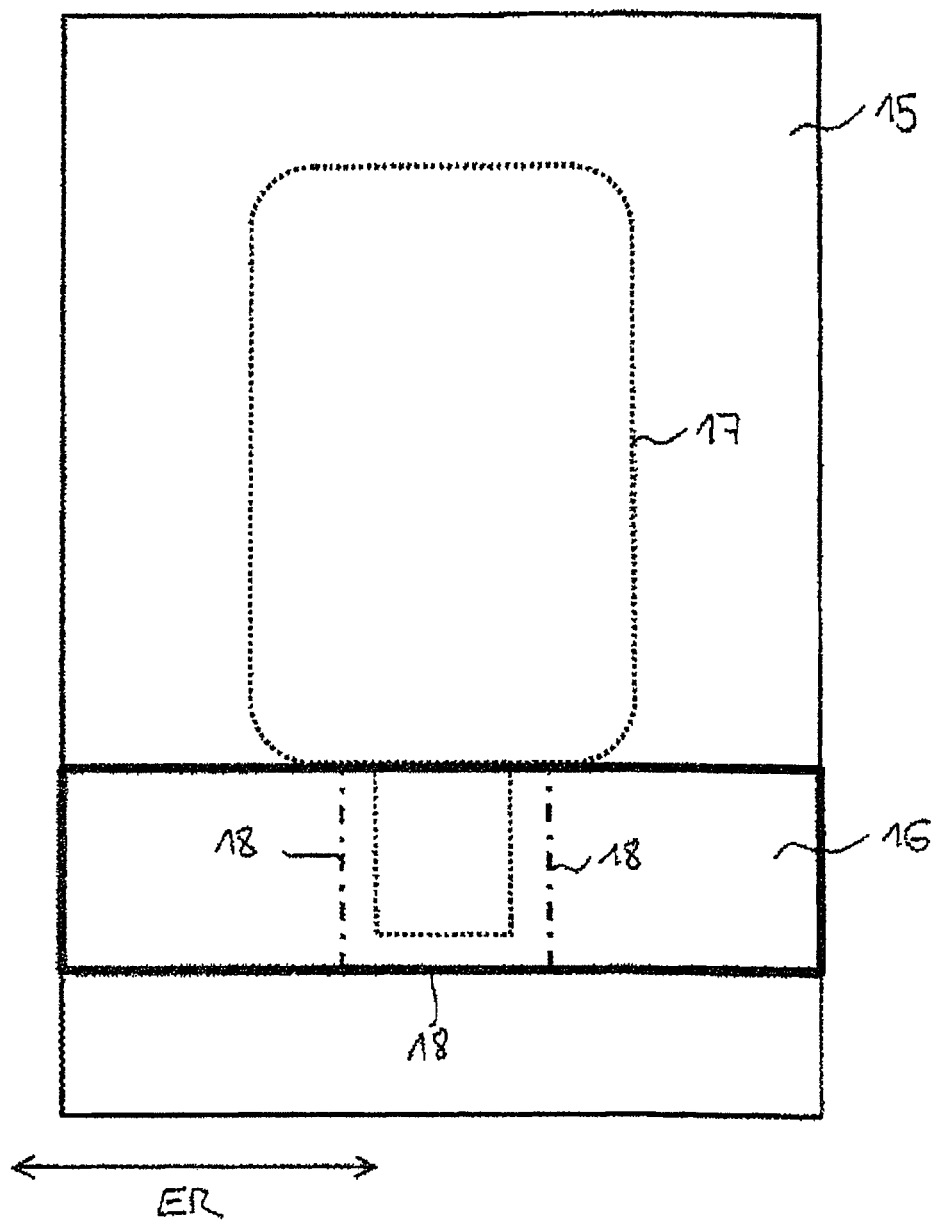
FIGS. 5A and 5B show a method for manufacturing the film body for the layer electrode of FIGS. 1, 2A, and 2B, before the layer electrode is back-molded.
Figure 5B:
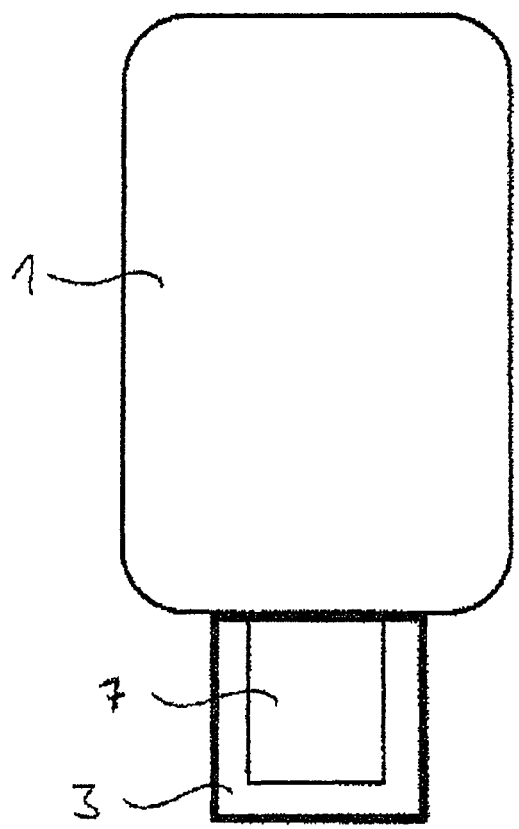

FIGS. 5*a* and 5*b* show by way of example a method for manufacturing the film body, for example according to FIGS. 2A and 2B, before it is back-injection molded.

FIG. 5*a* shows a cut-out from an endless sheet of a film 15, from which a layer electrode 1 according to the invention is preferably formed. These films are known from DE 10 2009 014 575.8 and are preferably made of a polyolefin as transparent carrier material with a pattern made of conductive tracks, wherein the measurements of the tracks and the pattern formed by them are selected such that the film is conductive, but remains transparent for the human eye despite the non-transparent conductive tracks.

On this endless sheet of film 15, a thin strip 16 is applied, from which the sacrificial films can be formed. In the direction of extension ER, this film composite from film 15 and strip 16 is for example kilometers long and wound up on a roll. The strip is advantageously structured and processed in the roll-to-roll method. For example, a laser beam with a first intensity is applied along a cutting line 17, in order to cut through the film 15 for example with a film thickness in the range of 30 μm to 70 μm. Thus layer electrodes 1 with tails 7 can be cut out from the strip. During the subsequent or previous cut with a laser beam of suitable intensity, the strip with the material for the sacrificial film 3, for example with a film thickness in the range of 50 μm to 100 μm, is cut through along the cutting line 18. Since in the area of the contours for the sacrificial film 3, the strip 16 and the sheet 15 must be cut through, a correspondingly suitable laser beam, which can cut both films, is to be selected here.

According to the method, a film body, as is shown in FIG. 2*a*, can be produced. This is shown again in FIG. 5 *b* with layer electrode 1, tail 7 and sacrificial film 3.

Figure 6A:
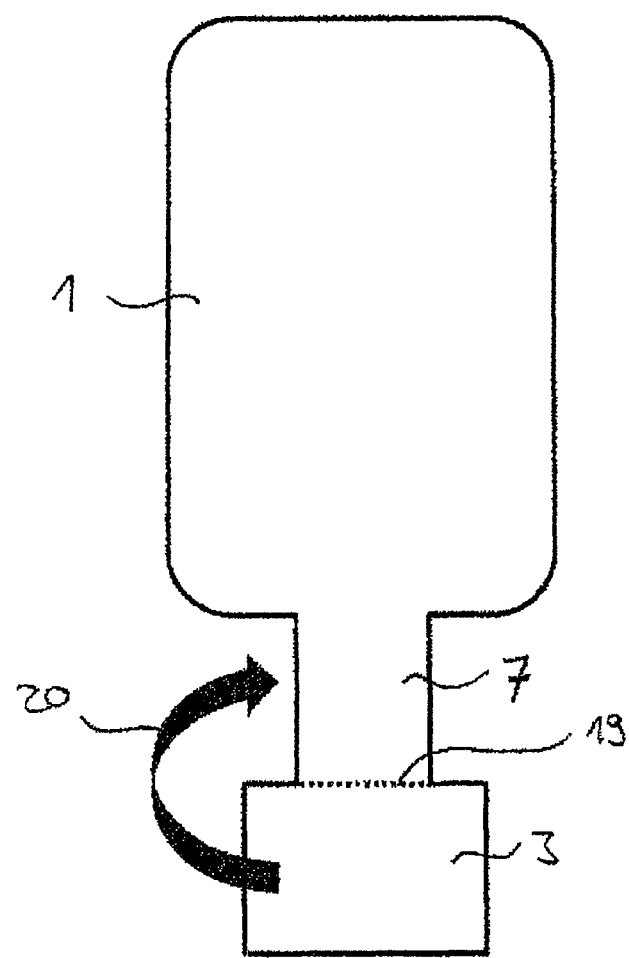
FIGS. 6A and 6B are perspective views of forming the film body of the layer electrode from a sheet.
Figure 6B:
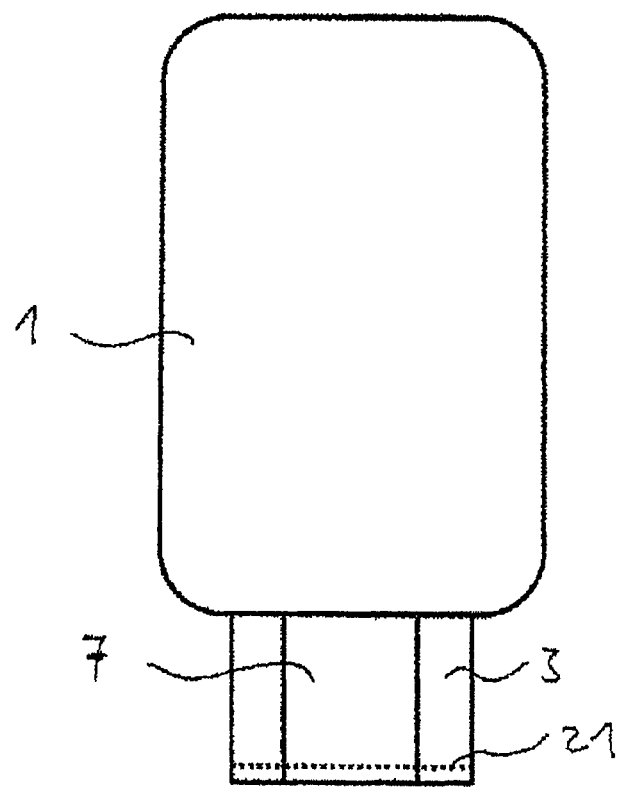

Alternatively, the film body can be produced from a sheet, as shown in FIGS. 6A and 6B. Here, a film, which comprises layer electrode 1, tail 7 and sacrificial film 3, is cut out from a layer. This film has a predetermined folding point 19, along which the film is folded over such that the sacrificial film 3, which initially adjoined the tail 7, lies on or under it. For this, the film is folded along the line 19 and in direction 20. After the back-injection molding was carried out, the folding strip 21 is cut off, for example by means of laser cutting, whereby the tail 7 is removed from the sacrificial film 3 without difficulty. In the back-injection molding tool 2 shown, this embodiment is then preferably back-injection molded from the direction of injection 5, because then the injection flap formed (not shown) can be cut off together with the folding strip 21.

Figure 7A:
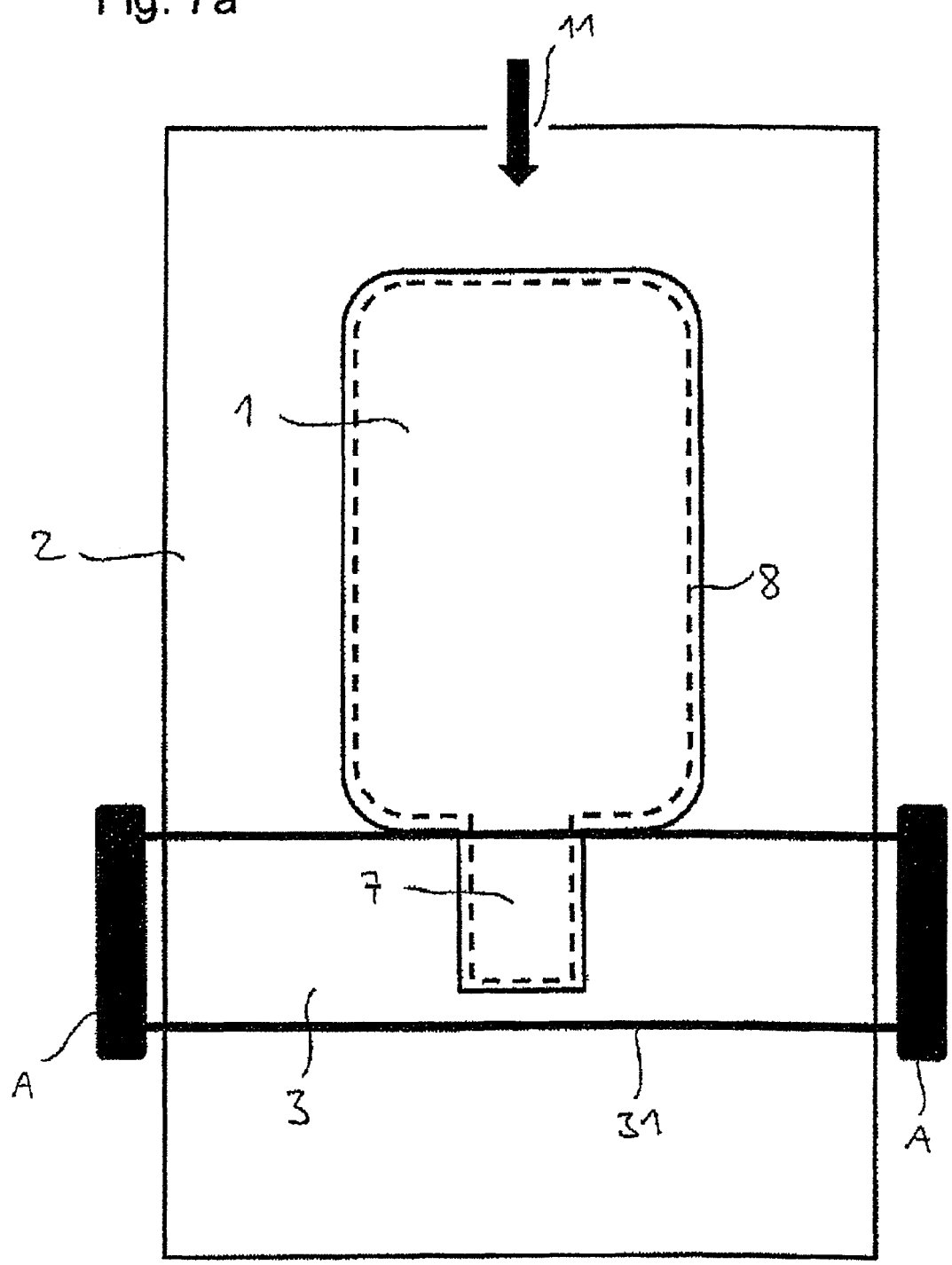
Figure 7B:
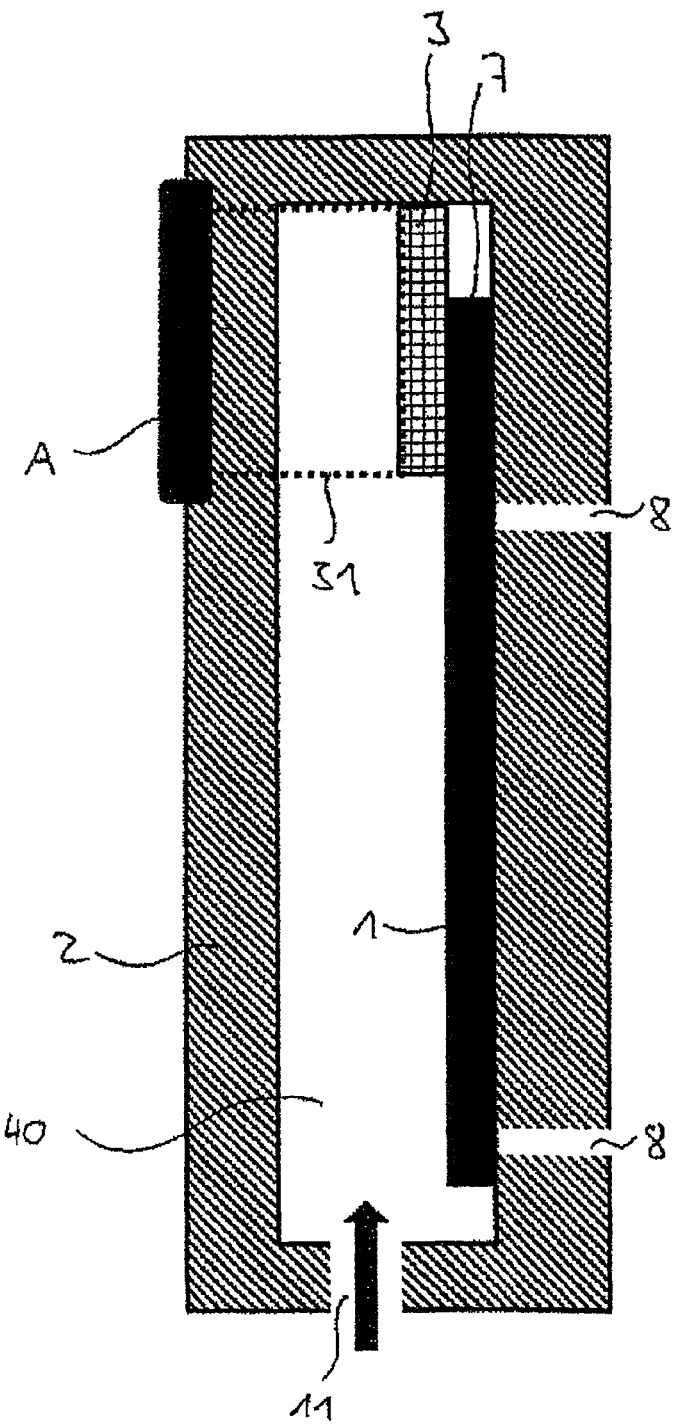

FIGS. 7*a* and 7*b* show a back-injection molding tool 2 with a strip fixing A, on which a protective strip 31 is attached, which assumes the function of the sacrificial film 3. As seen from FIG. 7*b*, when the back-injection molding tool 2 is closed, the protective strip 31 is arranged such that it is still attached to the strip fixing A, but it is arched such that at the point of the tail 7, it is applied to the latter as sacrificial film 3. Although the protective strip 31 is also back-injection molded during the back-injection molding, it can subsequently be pushed upwards out of its position, and thus expose a back-injection molded body 10, which comprises a back-injection molded layer electrode 1 and an exposed tail 7. The cavity in the back-injection molding tool 2, in which the back-injection molded body 10 is formed, is labeled 40.

After the back-injection molding was carried out, the protective strip 31 is pushed out of the back-injection molding tool 2 and is available for a further back-injection molding process according to a preferred embodiment.

For this, the protective strip 31 is advantageously equipped with a non-stick coating at least on one side. For example, the protective strip 31 has the non-stick coating on the side facing the back-injection molding material, such that the back-injection molding material does not adhere to the protective strip 31 and the removal can be carried out without difficulty.

After several back-injection molding processes, the non-stick coating can be exhausted/used up. It can therefore be provided that the protective strip 31 is arranged on the strip fixings A as an endless roll such that it can be wound up. In each case after a few back-injection molding processes, the protective strip 31 can be wound forward and fresh film material is available as protective strip 31.

FIG. 7c shows a variation of this embodiment of the method with the protective strip 31: flaps 32*a* to 32*c*, which serve as sacrificial films 3, are formed on the protective strip 31. On introducing the film body made of layer electrode 1 with tail 7 into the back-injection molding tool 2, precisely one of these flaps 32*a* to 32*c* of the protective strip 31 comes to lie on the tail 7. After the back-injection molding process, the flap 32*b* is cut off along the contour line 41. The cutting off is carried out for example by means of laser cutting, but can also be carried out by breaking a predetermined breaking point along the contour line 41, which is for example formed by means of a perforation provided there. Breaking such a predetermined breaking point along the contour line 41 can be caused for example simply by winding forward the protective strip 31.

This embodiment is illustrated in FIG. 7c in that, before it is introduced into the back-injection molding tool 2, the protective strip 31 coming from the right has a flap 32*a*, which has a predetermined breaking point (not shown). The protective strip is wound to the left for the back-injection molding, such that the flap 32*b* is then back-injection molded together with the film body made of the layer electrode 1 and tail 7, wherein it covers the tail 7 as flap 32*b*. After the back-injection molding, the protective strip 31 is wound further to the left via the endless rolls A' for the strip fixing, wherein the predetermined breaking point breaks along the contour line 41 and thus the protective strip 31 displays only one other connection point 32*c* on the other side of the back-injection molding tool 2. The main part, referred to as flap 32*b*, remains in this instance as sacrificial film 3 on the back-injection molded body 10 after the back-injection molding. For the subsequent back-injection molding process, a new flap 32*a* of the protective strip 31 is provided by further winding by means of the endless roll A'.

LIST OF REFERENCE NUMBERS NO. 149

1. Layer electrode
2. Back-injection molding tool
3. Sacrificial film
4. Opening to the right for the intake of the back-injection molding material
5. Opening at the bottom for the intake of the back-injection molding material
6. Opening to the left for the intake of the back-injection molding material
7. Tail
8. Vacuum line layer electrode
9. Vacuum line sacrificial film
10. Back-injection molded body
11. Opening at the top for the intake of the back-injection molding material
12. Cutting line on the tail 7
13. Cutting line on the injection flap 14
14. Injection flap
15. Conductive film
16. Sacrificial film strip
17. Cutting line for layer electrode 1 and tail 7
18. Cutting line for sacrificial film
19. Predetermined fold line for folding
20. Direction of folding
21. Folding strip
22. Contour
25 Adhesive strip
26 Connecting line between sacrificial film 3 and layer electrode 1
31 Protective strip
32 Flap on the protective strip
40 Cavity
41 Contour line on the flap 32 of the protective strip 31
A Strip fixing
A' Endless roll for the strip fixing

The invention claimed is:

1. A method of molding a layer electrode for producing a touch-sensitive sensor, wherein said layer electrode includes at least one tail portion that is not to be back-injection molded, said method comprising:
   (a) covering said at least one tail portion with a sacrificial film;
   (b) introducing said layer electrode and said sacrificial film into a back-injection molding tool, wherein said back-injection molding tool contains a back-injection molding material;
   (c) back-injection molding said layer electrode and said sacrificial film to produce a back-injection molded body, wherein during said back-injection molding, said sacrificial film binds to said back-injection molding material, and said at least one tail of said layer electrode lies on said sacrificial film and can be moved freely; and
   (d) forming a touch-sensitive sensor from said produced back-injection molded body.

2. The method of claim 1 wherein said back-injection molding tool has an opening according to the dimensions, contour, and/or location of said back-injection molding tool, whereby there is provided a minimized amount of back-injection molding material between said at least one tail and said sacrificial film.

3. The method of claim 1 wherein said touch-sensitive sensor is formed from said back-injection molded body by applying a laser to said back-injection molded body, whereby said laser cuts said back-injection molded body to form said touch-sensitive sensor.

4. The method of claim 1 wherein said sacrificial film has approximately the same shape and the same surface area as said tail.

5. The method of claim 1 wherein said sacrificial film is a protective strip.

6. The method of claim 1 wherein said back-injection molded body has an area free of said layer electrode, and wherein said sacrificial film projects beyond said area free of said layer electrode.

7. The method of claim 1 wherein step (b) comprises fixing said layer electrode into said back-injection molding tool with at least one first vacuum line, and fixing said sacrificial film in said back-injection molding tool.

8. The method of claim 7 wherein said sacrificial film is fixed in said back-injection molding tool with at least one second vacuum line.

9. The method of claim 8 wherein said at least one first vacuum line and said at least one second vacuum line are controlled independently of each other.

10. The method of claim 1 wherein said sacrificial film is transparent.

11. The method of claim 1 wherein said sacrificial film has a thickness of from 1 µm to 250 µm.

12. The method of claim 1 wherein said at least one tail of said layer electrode is covered, and the covering of said at least one tail is formed by folding said sacrificial film along a folding strip.

* * * * *